(12) United States Patent
Wickström et al.

(10) Patent No.: US 6,368,890 B1
(45) Date of Patent: Apr. 9, 2002

(54) TOP CONTACT VCSEL WITH MONITOR

(75) Inventors: Mikael Wickström; Jan Jönsson; Vilhelm Oskarsson, all of Järfälla (SE)

(73) Assignee: Mitel Semiconductor AB, Jarfalla (SE)

( * ) Notice: Subject to any disclaimer, the term of this patent is extended or adjusted under 35 U.S.C. 154(b) by 0 days.

(21) Appl. No.: 09/506,895

(22) Filed: Feb. 18, 2000

Related U.S. Application Data

(63) Continuation-in-part of application No. 09/419,810, filed on Oct. 18, 1999.

(30) Foreign Application Priority Data

May 5, 1999 (GB) .............................................. 9910202

(51) Int. Cl.⁷ .............................................. H01L 21/00
(52) U.S. Cl. .............................. 438/29; 438/55; 372/96
(58) Field of Search ...................... 438/29, 55

(56) References Cited

U.S. PATENT DOCUMENTS

| | | | | |
|---|---|---|---|---|
| 5,513,202 A | * | 4/1996 | Kobayashi et al. | 372/96 |
| 5,574,744 A | * | 11/1996 | Gaw et al. | |
| 5,577,064 A | * | 11/1996 | Swirhum et al. | 372/96 |
| 5,724,376 A | * | 3/1998 | Kish, Jr. et sl. | 372/96 |
| 5,729,566 A | * | 3/1998 | Jewell | 372/96 |
| 5,732,101 A | * | 3/1998 | Shin | 372/92 |
| 5,812,581 A | * | 9/1998 | Cox | 372/50 |
| 5,812,582 A | * | 9/1998 | Gilliland et al. | 372/50 |
| 5,835,514 A | * | 11/1998 | Yuen et al. | 372/36 |
| 5,857,049 A | * | 1/1999 | Beranek et al. | 385/91 |
| 5,907,571 A | * | 5/1999 | Ogino et al. | |
| 5,943,357 A | * | 8/1999 | Lebby et al. | |
| 6,005,262 A | * | 12/1999 | Cunningham et al. | 257/84 |
| 6,034,981 A | * | 3/2000 | Kim | 372/50 |
| 6,037,644 A | * | 3/2000 | Daghighian et al. | 257/444 |
| 6,083,768 A | * | 7/2000 | Jiang et al. | 438/25 |
| 6,111,903 A | * | 8/2000 | Isakasson et al. | 372/43 |
| 6,128,134 A | * | 10/2000 | Feldman et al. | 359/565 |
| 6,189,208 B1 | * | 2/2001 | Estes et al. | 29/840 |
| 6,210,514 B1 | * | 4/2001 | Cheung et al. | 156/241 |

FOREIGN PATENT DOCUMENTS

| | | |
|---|---|---|
| EP | 0786 836 A2 | 7/1997 |
| GB | 2 300 301 | 10/1996 |
| JP | 08-236554 A | 9/1996 |

* cited by examiner

Primary Examiner—Charles Bowers
Assistant Examiner—Stephen W. Smoot
(74) Attorney, Agent, or Firm—Lawrence E. Laubscher, Jr.

(57) ABSTRACT

A vertical cavity surface emitting laser (VCSEL) and monitoring diode combination having reduced parasitic capacitance for use in high bandwidth communications systems. The VCSEL has both p-type and n-type contacts on the same face. This allows the VCSEL to be mounted on a monitor chip or diode without using a metal contact layer. In an embodiment wherein the VCSEL is soldered to the monitor chip for mechanical stability only a small metal pad no larger than the VCSEL is used. The reduction in metallization results in a lower parasitic capacitance that in turn results in higher potential operational speeds

7 Claims, 2 Drawing Sheets

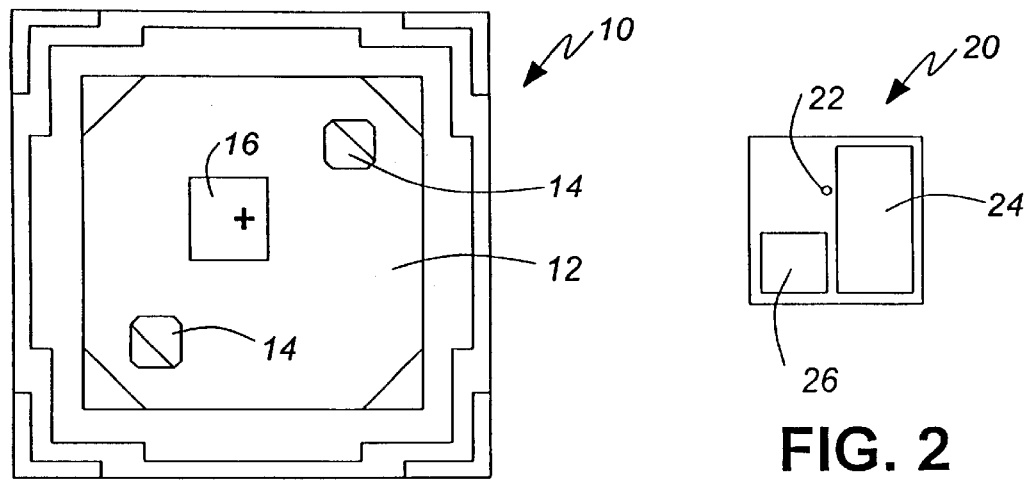
FIG. 1
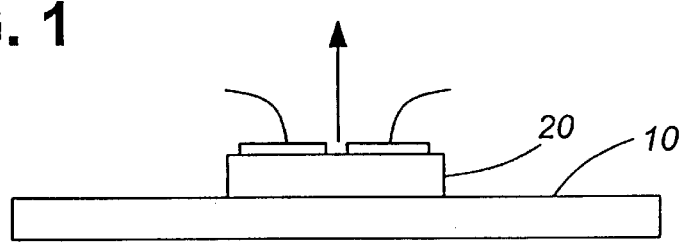
FIG. 2
FIG. 3
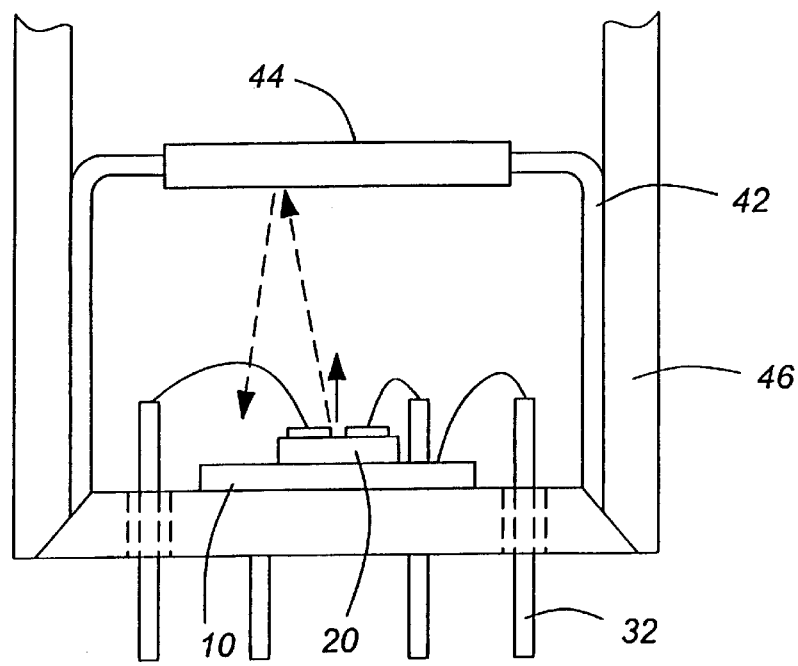
FIG. 4

TOP CONTACT VCSEL WITH MONITOR

This application is a continuation-in-part of U.S. application Ser. No. 09/419,810 filed Oct. 18, 1999.

FIELD OF THE INVENTION

This invention relates to a vertical cavity, surface emitting laser (VCSEL) with associated output monitoring device and more particularly to such a combination for use in high bandwidth applications.

BACKGROUND OF THE INVENTION

Lasers, and in particular semiconductor lasers, such as those formed of III-V compounds, are commonly employed as the transmitter in digital communication systems. Lasers of this type are particularly well suited for optical fiber based systems wherein the optical output of the laser is modulated in accordance with an electrical input to the device. The modulated optical signal can be transferred over relatively long distances using current optical fiber transmission systems.

Early lasers used in such applications included edge emitting lasers wherein the cleaved edges of the device provided the reflecting faces of the Fabry-Perrot cavity. Edge emitting lasers, however, have certain limitations with respect to pre-assembly testing and mounting techniques for efficient coupling to small diameter optical fibers.

Surface emitting lasers and in particular vertical cavity surface emitting lasers (VCSELs) have been developed recently and provide an improvement over edge emitting devices for use in optical fiber communication applications. The VCSEL which has its active region located between two reflecting layers, such as Bragg mirrors, emits in a plane normal to one of the two major surface of the laser device. As is known such devices include material of a first conductivity type, for example n-type, for one of the Bragg mirrors and material of a second conductivity type, namely p-type, for the other Bragg mirror. The intermediate active region or layer may include a cladding layer adjacent each of the Bragg mirrors. The Bragg mirrors are typically formed of alternate layers of III-V semiconductor material each layer having a different reflectivity characteristic. Each alternate layer typically has a thickness equal to one quarter wavelength based on the emission wavelength of the active material.

In this structure, and in particular top emitting VCSELs, the back or bottom surface of the device is usually attached to a mounting substrate and the laser output is emitted through the top or front face of the device. An emitting aperture, which may be defined by one of the device contacts, is typically configured to allow alignment with an optical fiber. Such devices are fabricated using well established processing techniques and provide reliable lasers which may be conveniently assembled into optical transmitter units.

The nature of VCSELs, and indeed semiconductor lasers in general, is that the electrical and optical characteristics between each device may vary slightly. The optical output taken as a function of input current during lasing action represents a steep slope and minor variations in the operating environment can result in significant output changes. For this reason, it is common to include a monitoring diode or monitor chip with a VCSEL, wherein the monitor chip is arranged to receive a representative portion of the optical output. This representative output can be used to calibrate each laser device or it can be used in a feedback mode to control the optical output of the laser. Control may be required to ensure that the optical output of the laser falls within a preset limit such as might be required by "eye safe" regulations prescribed by Standards Agencies. Typically the monitoring diode will be a phototransistor such as a PIN device having a sensitivity curve generally matched to the wavelength output of the laser.

Laser/monitor combinations are frequently mounted in a specially designed package such as a TO-46 can which has a mounting base with insulated connector leads and a sealed cover. The cover has a window of glass or other suitable transparent material over a central portion of the top such that the window is aligned with the emitting aperture of the lasing device. One such combination is described in U.S. Pat. No. 5,812,582 which issued Sep. 22, 1998 to Gilliland et al. In the U.S. Pat. No. 5,812,582 the photodiode is mounted on an insulated substrate that is positioned within in a TO-46 can, or the like. A large portion of the top surface of the photodiode is covered with a metal layer or mask. A VCSEL is electrically attached to the mask by solder or conductive epoxy and one of the contacts to the VCSEL, i.e. the back contact, is made by way of the mask. The top or emitting surface contact is through a wire bond to one of the isolated connectors in the TO-46 can.

The bandwidth capacity of current optical fibers far exceeds the bandwidth utilized by present day communication systems. Accordingly, there is a continuing effort to increase the data rate of communication systems in order to make better usage of optical fiber capabilities. Since the laser transmitter represents an important aspect of the complete communication system it is important that the switching rate of the laser be as high as possible. One factor which effects the switching rate in high speed devices is the parasitic capacitance of the VCSEL, the monitoring chip and the mounting configuration.

A further important consideration, of Course is the cost of the optical transmitter or laser/monitor assembly. This cost includes the material processing costs as well as the cost of assembling the devices and in accurately aligning the device in relation to an optical fiber.

It is, accordingly, an object of the present invention to provide a low cost VCSEL/monitor device with reduced parasitic capacitance for high bandwidth applications.

SUMMARY OF THE INVENTION

In a preferred embodiment of the present invention there is provided a VCSEL/monitor assembly in which the VCSEL has both p-type and in-type contacts on the top or emitting face and is mounted on a monitoring diode utilizing little or no metallization in the mounting process.

Therefore, in accordance with a first aspect of the present invention there is provided a vertical cavity surface emitting laser (VCSEL) and photo detecting monitor assembly comprising: a photo detecting monitor chip having a first photo detecting face and a second face parallel thereto; a top emitting VCSEL, mounted on the first face of the monitor chip, the VCSEL having both p-type and n-type contacts on a top surface thereof; and means associated with the assembly to direct a portion of the VCSEL emission to the first face of the monitor chip.

In accordance with a second aspect of the present invention there is provided a method of assembling a top emitting vertical cavity surface emitting laser (VCSEL) and photo detecting optical output monitoring chip pair comprising: providing a monitoring chip having a photo detecting surface; attaching a top emitting VCSEL to the detecting surface, the VCSEL having p-type and n-type contacts on the top surface; and providing means to contact the monitoring chip and the VCSEL.

BRIEF DESCRIPTION OF THE DRAWINGS

The invention will now be described in greater detail with reference to the attached drawings wherein:

FIG. 1 is a top view of a monitor chip;

FIG. 2 is a top view of a top emitting VCSEL having both contacts on the emitting face;

FIG. 3 is a cross-sectional view of a VCSEL mounted on a monitor chip according to the present invention;

FIG. 4 is a cross-sectional view of the assembly in a mounting case including a receptacle or sleeve for use in the connection to an optical fiber.

DETAILED DESCRIPTION OF THE INVENTION

Figure 5:
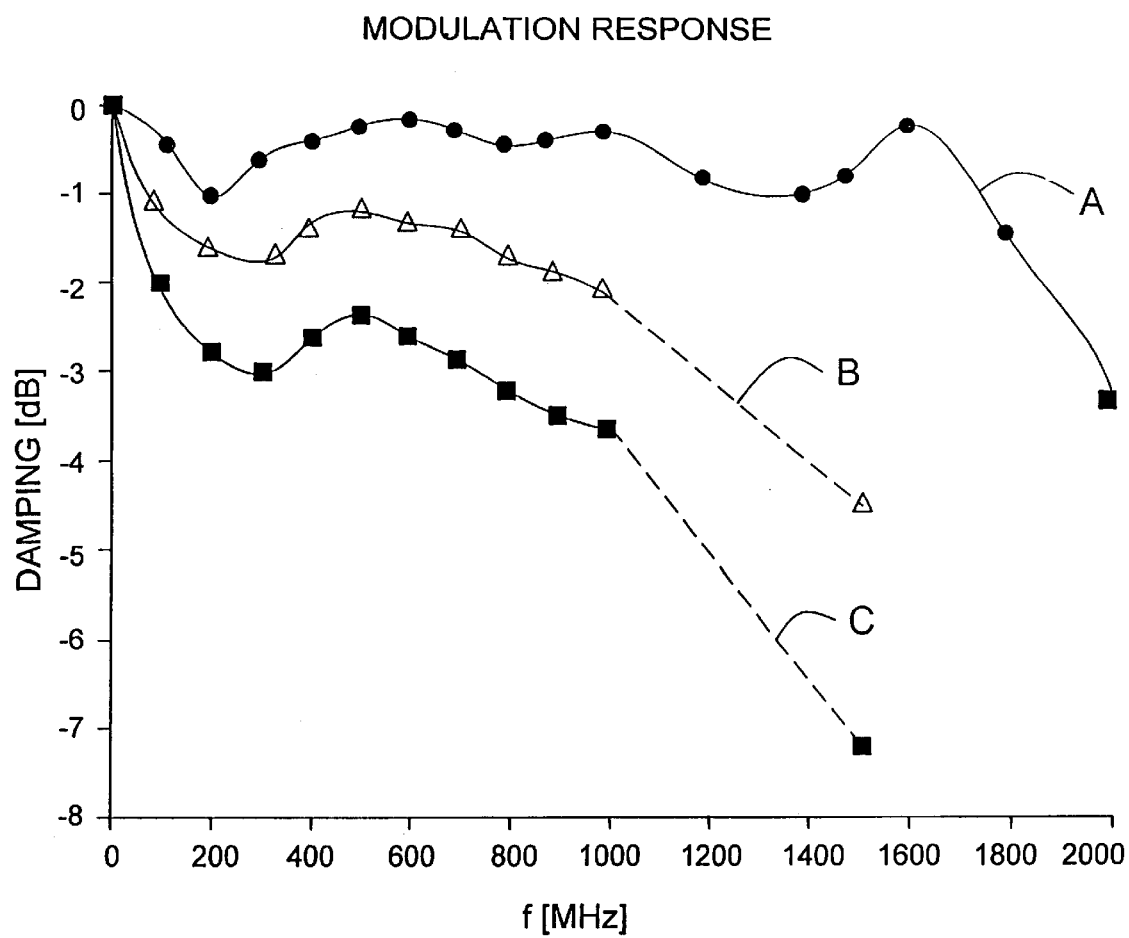
FIG. 5 is a bandwidth curve showing modulation response as a function of frequency.

FIG. 1 represents one example of a monitor chip 10 for use in the present invention. The monitor is a photodiode, PIN, avalanche diode etc. In operation, surface 12 is impinged with optical energy of an appropriate wavelength and this will result in an electrical output across contacts on the device. The electrical output will be dependent on the intensity of the optical energy (from the laser in this application) which is received by the photo detecting or monitor chip. One electrical contact is provided on the back surface (not shown) and it may be connected to a lead wire or mounted directly onto a substrate by well known means. Similarly, a contact to the top or front face can be made by way of wire bonds to one or both of contact pads 14. Alternatively, the monitor diode may have both contacts on the same side and the electrical connections made by bonding to the pins, for contacts on top side, or by means of patterned electrodes on the photodiode carrier for contacts on the bottom side.

As shown in FIG. 1, centrally positioned on the top surface of the monitor chip is an alignment mark 16. This may be a square, or substantial square, as shown in FIG. 1 and correspond to the shape or outline of a VCSEL, to be described later. Alternatively the alignment mark 16 may represent a small portion of the VCSEL outline. The alignment mark can be formed of an appropriate metal in order to allow the VCSEL to be soldered in an accurately aligned relationship with respect to the photodiode. This alignment is important in relation to system packaging as will be described later. Alternatively, the alignment mark may be of a non-metallic layer as long as it provides a stable surface while providing a suitable alignment mark. It is, of course, possible in certain assembly techniques to position the VCSEL accurately on the monitor chip without the aid of a special alignment mark. For example, the contact pattern or chip edge can be utilized for alignment purposes.

As shown in FIG. 2, the VCSEL 20 according to the present invention has both p and n-type contacts on the top surface. An emitting aperture 22 will typically be defined by one of the contacts 24 (for example p-type) which will be connected to the p-type Bragg mirror of the VCSEL structure. A second contact 26, n-type in this example, will be connected to the n-type Bragg mirror as is known in the art. A current aperture is typically provided in the active region (not shown) in order to confine the injection current to the desired region of the structure. Contact pads 24 and 26 are formed of suitable material for accepting wire bonds or the like for connection to a suitable input source.

VCSEL 20 is shown in FIG. 2 as being substantially square while it is to be understood that other shapes and sizes of devices can be used in the present invention. The alignment mark 16 on the monitor chip will, of course, need to be modified to correspond generally to the shape and size of the VCSEL chip if other configurations are used.

It is also within the scope of the present invention to use a bottom emitting VCSEL having both p-type and n-type contacts on the bottom face.

FIG. 3 shows a cross section of a VCSEL 20 stacked or mounted on the monitor chip 10. If the alignment mark is formed of metal the back face of the VCSEL chip will have a suitable metallization to allow the VCSEL to be attached to the monitor chip by soldering. In this case the VCSEL will be self-aligned to the alignment mark by the soldering process. It is to be understood that the alignment mark can be restricted to some portion of the size of the VCSEL and still result in a good mechanical connection and be suitably aligned.

The VCSEL can also be attached to the monitor chip by a suitable adhesive, many of which are available for such purposes. The alignment mark in this case will preferably not be metal but some other material such as a dielectric again having a pattern designed to assist an operator in the proper location of the VCSEL in relation to the monitor chip. As previously discussed certain assembly techniques will allow an operator to position the VCSEL on the monitoring chip without the use of any special alignment marks.

Adhesive materials which have proven to be suitable for attachment of the VCSEL to the monitor chip include certain epoxies and in particular thermoplastics. One such material is Alpha Metals Staystik Thermoplastic unfilled paste (101, 181) with appropriate thinner. Although the paste can be applied to the back face of individual die benefits are achieved by applying a layer of the paste to the back face of a fully processed wafer of VCSELs and spreading the paste into a thin uniform layer. The paste can be applied by several methods including screening but a particularly suitable method involves spinning. In this method the paste is applied to the center of the back face of a fully processed wafer and the wafer is placed on a spinner such as the type used for the application of photoresist. The spinning action causes the paste to be evenly spread over the face by centrifugal force. After spinning the thin layer of paste is dried by heating and thereby fused to the wafer. The temperature profile for the drying cycle is dependent on the paste used but may be up to 350 degrees C.

The dried and fused paste can be patterned by selectively removing material utilizing conventional lithographic processes. The wafer can then be scribed along the patterned lines and subsequently broken into individual VCSEL devices. Otherwise, the paste layer is left in a continuous covering and the wafer is placed on the typical blue sticky tape commonly used in the industry and the wafer is cut into individual VCSELs utilizing a wafer saw. The individual VCSELs are picked off of the blue tape and placed on top of the monitor chip using the aforementioned alignment marks if appropriate.

The combination is then heated to the point where the adhesive paste melts and upon subsequent cooling the VCSEL is firmly attached to the monitor chip.

The application of a thin, even layer of the paste by spinning, for example, results in a controllable thickness of the adhesive. The thin layer results in a much lower incidence of tilting of the VCSEL on the monitor chip when the paste is melted and subsequently cured. This is an important consideration since the VCSEL is used in an optical system and any misalignment can result in lower coupling characteristics. Further, an excess thickness of the paste will result in reduced thermal transfer through the device and this can impact device reliability.

The above mentioned technique of applying an adhesive paste to the VCSELs means that when the VCSEL is secured to the monitor chip the glue does not spread beyond the laser onto the surrounding monitoring area. This improves the tracking ratio, i.e. how well the monitor current describes the actual output of the VCSEL. Additionally, there isn't an excess of the adhesive that could contaminate the assembly tools and the VCSEL itself. As an additional benefit the glue protects the fragile back of the VCSEL while the device is being removed from the blue tape which may involve pushing it up with a pin or the like.

FIG. 4 is a cross sectional view of the assembly of FIG. 3 mounted in a package such as a conventional TO-46 can. As shown the can includes posts or connectors 32 which are normally isolated but one may be non-isolated for use in providing electrical input to the VCSEL and for monitoring the optical output of the VCSEL by way of the electrical signal generated across the monitor chip. The cover 42 includes a reflective surface 44 which may be a window or lens. The material for the reflective surface may be glass, plastic epoxy or other material at least partially transparent to the wavelength of the VCSEL. A portion of the laser output will be reflected by the window 44 back inside the cover and will impinge on monitor chip surface 12 thus providing a signal which is proportional to the VCSEL output.

As will be apparent the positioning of the emitting aperture of the VCSEL with respect to an optical fiber coupled to the arrangement is critical. Positioning the sub assembly, which may be a TO-46 can, a TO-56 can, a MT connector or other sub assembly, in relation to the fiber can be fixed by way of a receptacle or sleeve. It is therefore important that the VCSEL and hence the emitting aperture is well positioned with respect to the base of the TO-46 can. The alignment mark on the monitor chip assists in the positioning of the VCSEL with respect to the monitor chip and the positioning of the monitor chip with respect to the package can be arranged through other means. As shown in FIG. 4 the central axis of the emitting aperture is aligned with the center of window 44 and the longitudinal axis of an optical fiber (not shown).

By reducing the amount of metal in the VCSEL/monitor assembly of the present invention the parasitic capacitance is correspondingly reduced. The prior art device as described in U.S. Pat. No. 5,812,582 utilizes a metal mask or layer on top of the monitor chip. This mask in combination with the substrate on which the chip is mounted act as a plate capacitor and the parasitic capacitance produced by it can introduce a delay which affects high speed operation. Similarly, the VCSEL contacts, being on opposed faces, create another plate capacitor which also adds to the parasitic capacitance of the combination. In the present invention both VCSEL contacts are on the top or emitting face thereby reducing parasitic capacitance. Additionally, the metal mask on the monitor chip of the prior art device is not required by the present invention since no back face electrical connection is made.

The graphs in FIG. 5 compare the frequency response of devices made by the present invention (curve A) with devices made by prior art techniques (curves B and C). As shown the output of devices made in accordance with the present invention the remains substantially constant up to 1.7 GHz, even when the package is a TO-46 can which is not optimized for high frequencies. Applications for devices of the present invention include low and high speed data communications, for example 100 Mbps Ethernet, Gigabit Ethernet, Fiber Channel, and ATM or SDH and IEEE. Applications also include non-fiber applications like medical and chemical where the concentration of a substance is measured by means of its interaction with photons at the emitted wavelength. In fact, the invention pertains to any application where a monitor diode is needed for the feedback of optical power.

While particular embodiments of the invention have been described and illustrated it will be apparent to one skilled in the art that numerous variations can be effected without departing from the basic concept of the present invention. For example the shape and size of the VCSEL and monitor diode can be selected according to the application. The conductivity type of the VCSEL and monitor diode is not affected by the mounting technique, i.e. a VCSEL having a n-type substrate can be mounted on a p-type, an n-type or an isolating part of the monitor chip. The same is true of a VCSEL grown on a p-type substrate. Additionally, it is contemplated by the present invention to use thin adhesive preforms instead of the thin adhesive layer applied to the back face of the wafer by spinning. It is to be understood, however, that such variations will fall within the full scope of the invention as defined by the appended claims.

What is claimed is:

1. A method of assembling a top emitting vertical cavity surface emitting laser (VCSEL) and a photo detecting optical output monitoring chip pair, comprising providing a monitoring chip having electrical contacts and a photo detecting surface;

attaching said VCSEL to said photo detecting surface so that at least a portion of said photo detecting surface is uncovered, said VCSEL having a back face which is attached to said photo detecting surface with an electrically isolating adhesive and electrical contacts on a top face; and providing electrical connections to said monitoring chip and to said contacts on said VCSEL.

2. The method of claim 1 wherein said adhesive is an unfilled thermoplastic paste.

3. The method of claim 2 wherein said unfilled thermoplastic paste is applied to said VCSEL while said VCSEL is part of a wafer of VCSEL material and thereafter converted to a thin even layer by spinning.

4. The method of claim 3 wherein an individual VCSEL having a coating of thermoplastic adhesive on said back face is positioned on said monitor chip and heated to melt the adhesive so that upon cooling said VCSEL is retained on said monitor chip.

5. A method of applying adhesive to the mounting face of a vertical cavity surface emitting laser (VCSEL) for use in attaching the VCSEL to an optical monitoring device comprising:

applying an adhesive in a viscous form to the mounting face of a wafer, said wafer including a plurality of VCSELs, said adhesive being electrically isolating;

spinning said wafer to spread said adhesive into a thin uniform layer;

heating said wafer to cure said adhesive; and separating said wafer into individual VCSELs.

6. The method of claim 5, wherein an individual VCSEL is mounted on a monitor chip and heated to melt said adhesive such that said VCSEL is attached to said monitor chip upon cooling.

7. The method of claim 5, wherein said adhesive is an unfilled thermoplastic paste.

* * * * *